US009317352B2

(12) United States Patent
Murata

(10) Patent No.: US 9,317,352 B2
(45) Date of Patent: *Apr. 19, 2016

(54) GALOIS FIELD ARITHMETIC OPERATION CIRCUIT AND MEMORY DEVICE

(71) Applicant: Samsung Electronics Co., Ltd.

(72) Inventor: Koji Murata, Yokohama (JP)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 73 days.

This patent is subject to a terminal disclaimer.

(21) Appl. No.: 14/024,758

(22) Filed: Sep. 12, 2013

(65) Prior Publication Data

US 2014/0075267 A1 Mar. 13, 2014

(30) Foreign Application Priority Data

Sep. 12, 2012 (JP) ................................ 2012-200621
Apr. 11, 2013 (KR) ........................ 10-2013-0039897

(51) Int. Cl.
G06F 7/72 (2006.01)
H03M 13/00 (2006.01)
H03M 13/03 (2006.01)
G06F 11/07 (2006.01)
H03M 13/15 (2006.01)
H03M 13/19 (2006.01)
H03M 13/29 (2006.01)

(52) U.S. Cl.
CPC ......... *G06F 11/0727* (2013.01); *H03M 13/158* (2013.01); *H03M 13/152* (2013.01); *H03M 13/1515* (2013.01); *H03M 13/1545* (2013.01); *H03M 13/19* (2013.01); *H03M 13/2909* (2013.01)

(58) Field of Classification Search
CPC ............ H03M 13/15; H03M 13/1545; H03M 13/159; H03M 13/6516; H03M 13/09; H03M 13/07; H03M 13/033; G06F 11/0727; G06F 7/724; G06F 7/726
USPC .................. 714/781, E11.034, 758, 785, 764; 708/492
See application file for complete search history.

(56) References Cited

U.S. PATENT DOCUMENTS

| 4,754,458 | A | * | 6/1988 | Dornstetter | 714/762 |
| 8,464,141 | B2 | * | 6/2013 | Pilsl | 714/782 |
| 8,812,940 | B2 | * | 8/2014 | Pilsl | 714/785 |
| 8,925,075 | B2 | * | 12/2014 | Krendelev et al. | 726/22 |
| 8,990,667 | B2 | * | 3/2015 | Kuriyama | 714/785 |
| 2008/0140740 | A1 | * | 6/2008 | Williamson et al. | 708/200 |
| 2013/0073925 | A1 | * | 3/2013 | Mizushima | 714/763 |
| 2014/0108895 | A1 | * | 4/2014 | Fujiwara | 714/781 |

FOREIGN PATENT DOCUMENTS

JP 06-314979 11/1994

* cited by examiner

*Primary Examiner* — Phung M Chung
(74) *Attorney, Agent, or Firm* — Muir Patent Law, PLLC

(57) ABSTRACT

A Galois field arithmetic operation circuit substituting ($2^m-1$) elements (m is an integer) expressed by m bits of Galois field $GF(2^m)$ includes: a base calculation unit configured to calculate m linear independent elements out of the ($2^m-1$) elements; and a linear development unit configured to calculate the remaining ($2^m-1-m$) elements not included in the m linear independent elements by combination of the m linear independent elements respectively. The Galois field arithmetic operation circuit may be included in a memory device or other system.

12 Claims, 12 Drawing Sheets

Fig. 3

Galois field in case of a primitive polynomial $x^4+x+1$

| Becky power expression | Vector expression |
|---|---|
| 0 | 0000 |
| $1=\alpha^0$ | 0001 |
| $\alpha=\alpha^1$ | 0010 |
| $\alpha^2$ | 0100 |
| $\alpha^3$ | 1000 |
| $\alpha^4$ | 0011 |
| $\alpha^5$ | 0110 |
| $\alpha^6$ | 1100 |
| $\alpha^7$ | 1011 |
| $\alpha^8$ | 0101 |
| $\alpha^9$ | 1010 |
| $\alpha^{10}$ | 0111 |
| $\alpha^{11}$ | 1110 |
| $\alpha^{12}$ | 1111 |
| $\alpha^{13}$ | 1101 |
| $\alpha^{14}$ | 1001 |

$\alpha^4 = 1+\alpha$
$\alpha^5 = \alpha(1+\alpha) = \alpha+\alpha^2$
$\alpha^6 = \alpha(\alpha+\alpha^2) = \alpha^2+\alpha^3$
$\alpha^7 = \alpha(\alpha^2+\alpha^3) = \alpha^3+\alpha^4 = 1+\alpha+\alpha^3$
$\alpha^8 = \alpha(1+\alpha+\alpha^3) = \alpha+\alpha^2+\alpha^4 = 1+\alpha^2$
$\alpha^9 = \alpha(1+\alpha^2) = \alpha+\alpha^3$ $\alpha^{10} = \alpha(\alpha+\alpha^3) = \alpha^2+\alpha^4 = 1+\alpha+\alpha^2$
$\alpha^{11} = \alpha(1+\alpha+\alpha^2) = \alpha+\alpha^2+\alpha^3$
$\alpha^{12} = \alpha(\alpha+\alpha^2+\alpha^3) = \alpha^2+\alpha^3+\alpha^4 = 1+\alpha+\alpha^2+\alpha^3$
$\alpha^{13} = \alpha(1+\alpha+\alpha^2+\alpha^3) = \alpha+\alpha^2+\alpha^3+\alpha^4 = 1+\alpha^2+\alpha^3$
$\alpha^{14} = \alpha(1+\alpha^2+\alpha^3) = \alpha+\alpha^3+\alpha^4 = 1+\alpha^3$
$\alpha^{15} = \alpha(1+\alpha^3) = \alpha+\alpha^3 = 1$

Fig. 4

Galois field in case of a primitive polynomial $x^3+x+1$

| Becky power expression | Vector expression | Base expression |
|---|---|---|
| 0 | 000 | 0 |
| $1=\alpha^0$ | 001 | 1 |
| $\alpha=\alpha^1$ | 010 | $\alpha$ |
| $\alpha^2$ | 100 | $\alpha^2$ |
| $\alpha^3$ | 011 | $\alpha+1$ |
| $\alpha^4$ | 110 | $\alpha^2+\alpha$ |
| $\alpha^5$ | 111 | $\alpha^2+\alpha+1$ |
| $\alpha^6$ | 101 | $\alpha^2+1$ |

Case of conventional art

| $p_4 X^4$ | + | $p_2 X^2$ | + | $p_1 X$ | + | $p_3 X^3$ | + | $p_0$ |

Case of embodiment of the inventive concept

| $p_4 X^4 + p_2 X^2 + p_1 X$ | + | $p_3 X^3$ | + | $p_0$ |

Fig. 8

Circuit calculating $M(X) = \sigma_1 X + \sigma_2 X^2 + \sigma_4 X^2 + \cdots$

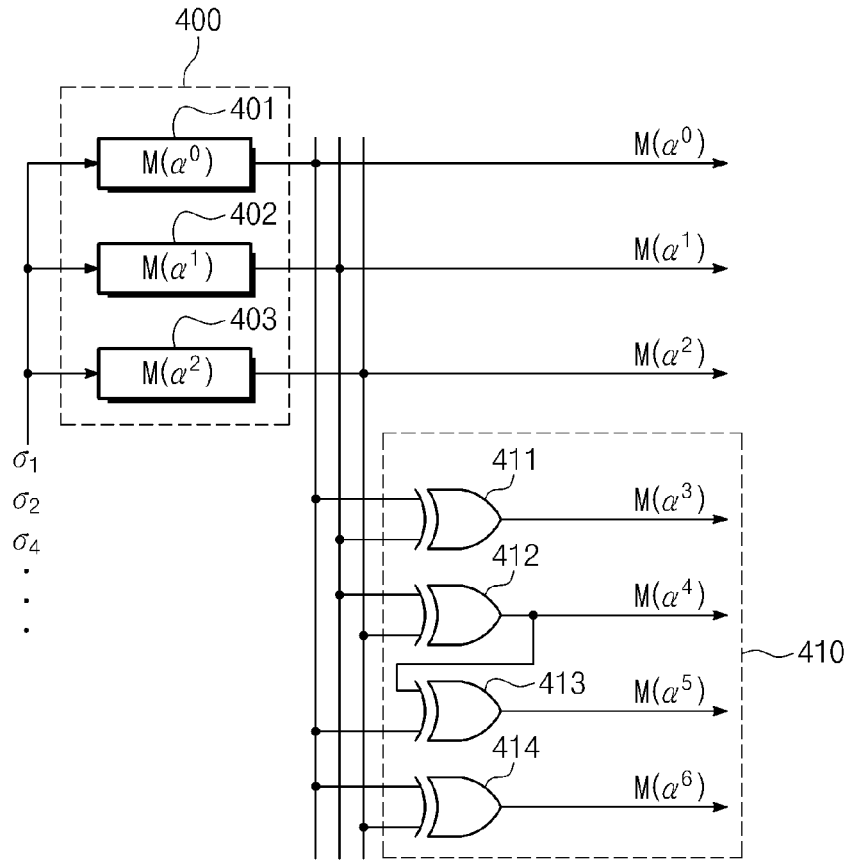

Fig. 9

Table 3
The cube of circle of table 2

| Becky power expression | Vector expression | Base expression |
|---|---|---|
| 0 | 000 | 0 |
| $1 = (\alpha^3)^0$ | 001 | 1 |
| $\alpha^3$ | 011 | $\alpha^3$ |
| $\alpha^6$ | 101 | $\alpha^6$ |
| $\alpha^9 = \alpha^2$ | 100 | $\alpha^6 + 1$ |
| $\alpha^{12} = \alpha^5$ | 111 | $\alpha^6 + \alpha^3 + 1$ |
| $\alpha^{15} = \alpha$ | 010 | $\alpha^3 + 1$ |
| $\alpha^{18} = \alpha^4$ | 110 | $\alpha^6 + \alpha^3$ |

Fig. 11A
Case of n=4

| m | Prior Art | Present embodiment form | Ratio | Difference |
|---|---|---|---|---|
| 1 | 4 | 4 | 1.000 | 0 |
| 2 | 39 | 34 | 0.872 | 5 |
| 3 | 189 | 125 | 0.661 | 64 |
| 4 | 690 | 338 | 0.490 | 352 |
| 5 | 2170 | 792 | 0.365 | 1378 |
| 6 | 6237 | 1734 | 0.278 | 4503 |
| 7 | 16891 | 3691 | 0.219 | 13200 |
| 8 | 43860 | 7798 | 0.178 | 36062 |
| 9 | 110376 | 16502 | 0.150 | 93874 |
| 10 | 271095 | 35066 | 0.129 | 236029 |
| 11 | 652993 | 74769 | 0.115 | 578224 |
| 12 | 1547910 | 159690 | 0.103 | 1388220 |
| 13 | 3620422 | 341044 | 0.094 | 3279378 |

Fig. 11B
Case of n=4

| m | Prior Art | Present embodiment form | Ratio | Difference |
|---|---|---|---|---|
| 1 | 16320 | 4711 | 0.289 | 11609 |
| 2 | 25500 | 4999 | 0.196 | 20501 |
| 3 | 34680 | 7510 | 0.217 | 27170 |
| 4 | 43860 | 7798 | 0.178 | 36062 |
| 5 | 53040 | 10309 | 0.194 | 42731 |
| 6 | 62220 | 10597 | 0.170 | 51623 |
| 7 | 71400 | 13108 | 0.184 | 58292 |
| 8 | 80580 | 13396 | 0.166 | 67184 |
| 9 | 89760 | 15907 | 0.177 | 73853 |
| 10 | 98940 | 16195 | 0.164 | 82745 |
| 11 | 108120 | 18706 | 0.173 | 89414 |
| 12 | 117300 | 18994 | 0.162 | 98306 |
| 13 | 126480 | 21505 | 0.170 | 104975 |

Circuit (fourth degree polynomial) for
finding a zero point of polynomial P(X)

Fig. 14

Matrix Operation (EXOR) converting vector $x=(x_3, x_2, x_1, x_0)$ into vector $y=(y_3, y_2, y_1, y_0)$ $$\begin{pmatrix} y_0 \\ y_1 \\ y_2 \\ y_3 \end{pmatrix} = \begin{pmatrix} 0 & 0 & 1 & 0 \\ 1 & 0 & 0 & 1 \\ 1 & 1 & 0 & 0 \\ 0 & 1 & 0 & 0 \end{pmatrix} \begin{pmatrix} x_0 \\ x_1 \\ x_2 \\ x_3 \end{pmatrix} \Leftrightarrow \begin{array}{l} y_0 = x_2 \\ y_1 = x_0 + x_3 \\ y_2 = x_0 + x_1 \\ y_3 = x_1 \end{array}$$

US 9,317,352 B2

GALOIS FIELD ARITHMETIC OPERATION CIRCUIT AND MEMORY DEVICE

CROSS-REFERENCE TO RELATED APPLICATIONS

This U.S. non-provisional patent application claims priority under 35 U.S.C. §119 of Korean Patent Application No. 10-2013-0039897, filed on Apr. 11, 2013, and of Japanese Patent Application No. JP2012-200621, filed on Sep. 12, 2012, the entire contents of both of which are hereby incorporated by reference.

BACKGROUND

The present disclosure relates to a Galois field arithmetic operation circuit being used as an error detection & correction circuit, and a memory device.

A NAND flash memory is known as one type of electrically erasable and programmable read only memory (EEPROM). A NAND flash memory uses a NAND cell unit (a NAND string) for which a plurality of memory cells are serially connected to one another. A NAND flash memory can store a large amount of data in a small area.

In a NAND flash memory, data content may be damaged due to various causes while keeping the data. For example, due to deterioration of a tunnel oxide film caused by performing a rewrite operation several times, a characteristic of memory device (memory cell) is deteriorated while keeping data and thereby an occurrence ratio of error bits (an error ratio) tends to increase. In particular, in a NAND flash memory, an error ratio tends to increase while a large-scale increase of memory capacity and miniaturization of manufacturing process are proceeding. To cope with that, an error detection & correction circuit is used to improve performance of a NAND flash memory. By mounting an error detection & correction circuit in an on-chip form, a high reliability memory can be provided.

Japanese Patent No. 06-314979, which is incorporated by reference herein in its entirety, describes a Galois field multiplier circuit that uses a Galois field arithmetic operation circuit by finite field (Galois field) (GF($2^m$)). The Galois field arithmetic operation circuit, when doing multiplication of two elements vector-expressed by m-bits on the Galois field (GF($2^m$)), operates an exclusive OR (EXOR) with respect to components of high-order bits except a low-order m-th bit during the multiplication operation and obtains a multiplied vector output by converting the operational output into a vector expression of m bits by a given primitive polynomial (f(X)), and then performing an exclusive OR (EXOR) on the vector expression and a component of a low-order m-th bit. Accordingly, a Galois field arithmetic operation circuit attempts simplification of a multiplication circuit constitution.

SUMMARY

In one embodiment, a Galois field arithmetic operation circuit substituting $2^m$ elements (m is an integer) expressed by m bits of a Galois field GF($2^m$) includes a base calculation unit configured to calculate m linear independent elements out of the ($2^m-1$) elements; and a linear development unit configured to calculate the remaining ($2^m-1-m$) elements not included in the m independent elements by combination of the m linear independent elements respectively.

One embodiment provides a memory device having an error correction circuit performing an error detection of data column being input. The error correction circuit comprises a syndrome calculation unit calculating a syndrome from the data column being input; an error coefficient calculation unit calculating a coefficient of an error location detection polynomial from the syndrome; a Galois field arithmetic operation circuit performing an arithmetic operation by substituting a value representing a location of a bit of data of the data column and the coefficient into the error location detection polynomial; a Chien search unit outputting an error detection signal indicating whether or not an error exists in each bit of the data column in response to a substitution result of the error location detection polynomial; and an error correction unit correcting an error of data of a bit of the data column to output the corrected data. The Galois field arithmetic operation circuit is configured to substitute ($2^m-1$) elements vector-represented by m bits on Galois field GF($2^m$) into the error location detection polynomial. The Galois field arithmetic operation circuit comprises a base calculation unit configured to calculate m linear independent elements out of ($2^m-1$) elements; and a linear development unit configured to calculate the remaining ($2^m-1-m$) elements not included in the m elements of the $2^m-1$ elements by combination of the m elements.

BRIEF DESCRIPTION OF THE FIGURES

Embodiments disclosed herein will be described below in more detail with reference to the accompanying drawings. The disclosure may, however, be embodied in different forms and should not be constructed as limited to the embodiments set forth herein. Like numbers refer to like elements throughout.

FIG. 3 is an exemplary table illustrating elements of a Galois field (FG($2^4$)).

FIG. 4 is an exemplary table illustrating elements of a Galois field.

FIG. 8 illustrates an example of a circuit calculating a linear section with respect to X.

FIG. 9 illustrates an example of cubing the element illustrated in the table of FIG. 4.

FIGS. 11A and 11B are drawings for explaining an exemplary cutting effect of a circuit device.

FIG. 14 illustrates an example of a matrix operation.

DETAILED DESCRIPTION

Figure 1:
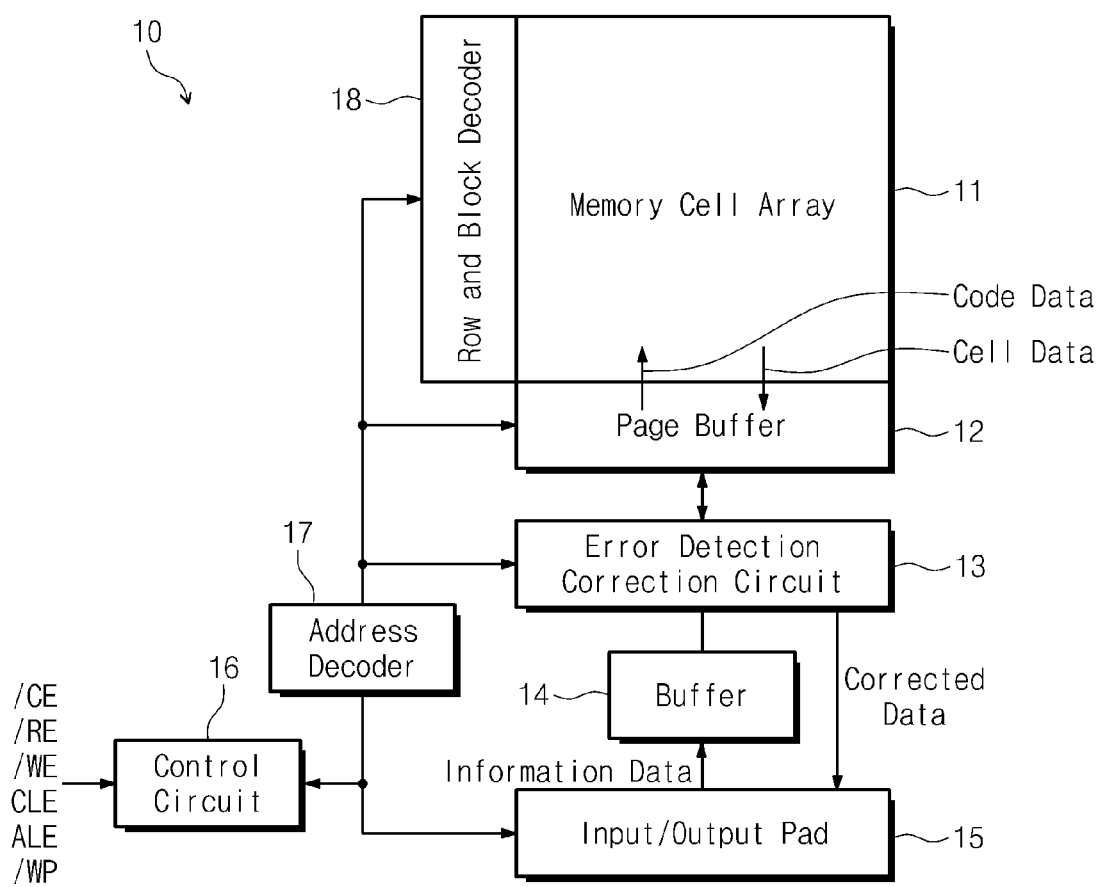
FIG. 1 illustrates a memory device in accordance with some example embodiments.

This disclosure will be described more fully hereinafter with reference to the accompanying drawings, in which various exemplary embodiments are shown. The inventive concept may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 12:
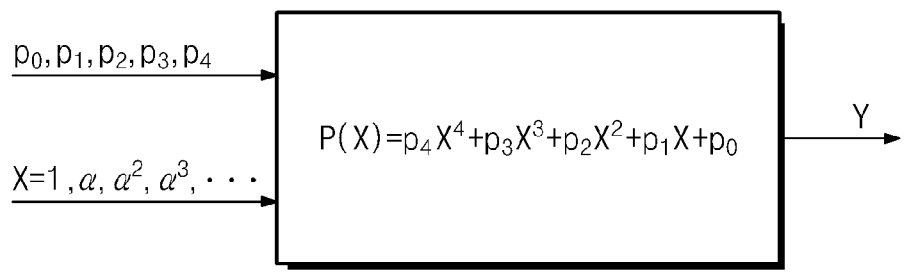
FIG. 12 illustrates an example of a Galois field arithmetic operation circuit obtaining a zero point of a conventional Galois field polynomial.

A conventional Galois field arithmetic operation circuit, for example, a four degree polynomial illustrated in FIG. 12, after coefficients (p0, p1, p2, p3, p4) of an error location detection polynomial P(X) are fixed, sequentially inputs $1(=\alpha^0)$, $\alpha(=\alpha^1)$, $\alpha^2$, $\alpha^3$, ... as Galois field element X to obtain a zero point.

A Galois field arithmetic operation circuit obtaining a zero point of a conventional Galois field polynomial calculates coefficients pi(i=0, 2, 3, 4) in a first order, calculates a section piXi in a second order and adds each section corresponding to i=0, 1, 3, 4 to one another in a third order. A zero point of the error location detection polynomial P(X) is obtained by performing the first, second and third orders on all the elements X(1, $\alpha$, $\alpha^2$, $\alpha^3$, ... ) that can be taken or parts of them.

However, since a zero point of the error location detection polynomial P(X) is obtained by sequentially inputting Galois field elements (1, $\alpha$, $\alpha^2$, $\alpha^3$, ... ), it takes a great deal of time to obtain a zero point.

To avoid this problem, a circuit (four degree polynomial) obtaining a zero point of the error location detection polynomial P(X) at a single time may be used. As shown in the Galois field arithmetic operation circuit illustrated in FIG. 13, calculation time of the error location detection polynomial can be greatly reduced by providing a parallel arithmetic operation circuit to each of the elements 1 ($\alpha^0$), $\alpha$, $\alpha^2$, $\alpha^3$, ..., $\alpha^{(t-2)}$ (only $t=2^m$). However, in the method illustrated in FIG. 13, since an error location detection polynomial P(X) with respect to all the X that can be taken are obtained at a same time, it does not take much time to obtain a zero point of each bit but a circuit size becomes large.

Figure 13:
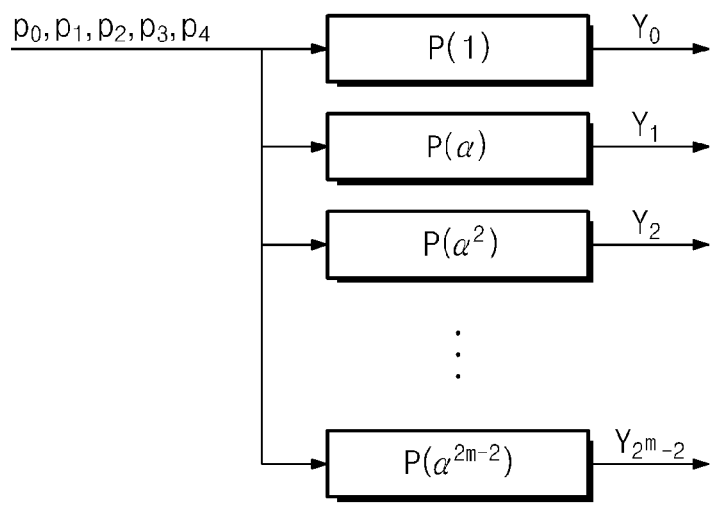
FIG. 13 illustrates an example of a Galois field arithmetic operation circuit using a parallel arithmetic operation circuit.

In a circuit constitution illustrated in FIG. 13, in a unit corresponding to each section of each unit, an arithmetic operation multiplying an integer is expressed as a matrix operation from a linear calculation (referring to the matrix operation illustrated in FIG. 14). The matrix being used in an arithmetic operation, when regarding Galois field element X as a vector, is a vector converting it into a different vector. In case of adopting a Galois field $GF(2^m)$ (m corresponds to a length of data when regarding a Galois field element X as binary data), a circuit corresponding to a matrix operation unit is constituted by about $m(m-1)/2$ number of ERROR elements. In case of n degrees of the polynomial, because of adding m bits to each other by (n+1) sections as a result of matrix operation, m×n number of ERROR elements are needed. If a value range which Galois field element X can take extends to the whole Galois field, the number of units of FIG. 13 is $2^m-1$ and the total becomes $(n+1)\times(2^m-1)\times m(m-1)/2+n\times(2^m-1)\times m$.

In case of m=8 and n=4, total 43800 EXOR devices are needed. Like that, even if converting a calculation of each section from a multiplication of two inputs into a matrix operation, a circuit size becomes very large.

The Galois field arithmetic operation circuit, as will be described later, reduces a circuit size using Galois field and linearity of each section of the error location detection polynomial. Each section of the error location detection polynomial is divided into a lot of parts such as a part "X, $X^2$, $X^4$, $X^8$, ... " having linearity with respect to Galois field element X, a part "$X^3$, $X^6$, $X^{12}$, ... " having linearity with respect to Galois field element $X^3$ and a part "$X^5$, $X^{10}$, $X^{20}$, ... " having linearity with respect to Galois field element $X^5$ and each part is combined into a same linear function. The combined linear function is divided into a base calculation unit calculating using a base value and a linear development unit, and an element is calculated.

The base calculation unit calculates an error location detection polynomial with respect to m elements (m being a positive integer) which have linear independence on a Galois field $GF(2^m)$. In a calculation of an error location detection polynomial corresponding to $2^m-1-m$ number of elements that does not include the m elements, by the linear development unit, a calculation is performed by adding a calculation result of the base calculation unit.

Thus, a circuit size of a Galois field arithmetic operation circuit may be reduced as compared with a Galois field arithmetic operation circuit calculating an error location detection polynomial at every element. A Galois field arithmetic operation circuit obtaining a zero point of an error location detection polynomial in a short time can be embodied to a circuit size that can be mounted on a semiconductor memory.

Memory Device Constitution

FIG. 1 illustrates a memory device in accordance with some example embodiments. As a memory device, a nonvolatile semiconductor memory device which is a NAND flash memory is illustrated in FIG. 1.

The nonvolatile semiconductor memory device 10 includes a memory cell array 11, a page buffer 12, an error detection & correction circuit 13, a buffer 14, an I/O pad 15, a control circuit 16, an address decoder 17 and a row and block decoder 18.

The nonvolatile semiconductor memory device 10 has the same constitution as a general NAND flash memory and a Galois field arithmetic operation circuit (an arithmetic operation circuit of an error location detection polynomial) installed in the error detection & correction circuit 13 has certain characteristics.

In one embodiment, the memory cell array 11 includes a plurality of transistors having a stack gate structure, for which electrically rewritable nonvolatile memory cells are serially connected in a column direction, and blocks in which a NAND string installed at every bit line are disposed in a row direction. The blocks are disposed to be plural in number in an arrangement direction of the bit lines. In one embodiment, the blocks are set by erasing data of the memory cells. In each block, a word line perpendicular to a bit line is connected to a gate of each of nonvolatile memory cells disposed in a same row. A range of nonvolatile memory cells selected by a word line constitutes a page, which is a read and program unit.

In one embodiment, the page buffer 12 includes a page buffer circuit installed at every bit line to perform a program and read of data of a page unit. Each of the page buffer circuits in the page buffer 12 includes a latch circuit used as a sense amplifier circuit which is connected to each bit line and amplifies and judges an electrical potential of the bit line.

The page buffer 12 receives cell data which memory cells of one page in the memory cell array 11 remember when the nonvolatile semiconductor memory device 10 performs a data read operation and then amplifies the received cell data to output the amplified cell data to the error detection & correction circuit 13. The page buffer 12 stores data provided from the error detection & correction circuit 13 in an internal latch circuit when the nonvolatile semiconductor memory device 10 performs a data program operation and then writes all the data in memory cells of one page as code data while performing a verification operation.

The code data includes parity data being generated by the error detection & correction circuit 13. In an error correction system performing a 4 bit correction using a bose-chaudhuri-hocquenghem (BCH) code with respect to data of which information length is 512 bytes, one page includes memory cells remembering ordinary data of 2 K(=2048) bytes, that is, 16 K(=16384) bits respectively and memory cells remembering parity data of 208 bits. As such, the cell data and the code data are constituted by (16 K+208) bits. One page is divided into four sections by correction units of the error detection & correction circuit 13. Data corresponding to one section is constituted by ordinary data of 512 bytes (=4096 bits) and parity data of 52 bits.

The error detection & correction circuit 13, when the nonvolatile semiconductor memory device 10 performs a data read operation, processes data read from the page buffer 12 by sector to calculate a coefficient of error location detection polynomial and then latches the calculated result to store it therein. The error detection & correction circuit 13, when the nonvolatile semiconductor memory device 10 performs a data read operation, corrects an error of data of every bit of which a location is indicated by a column address to output it to the outside through the I/O pad 15 as the corrected data.

The error detection & correction circuit 13, when the nonvolatile semiconductor memory device 10 performs a data write operation, receives information data being input from the I/O pad 15 through the buffer 14. The error detection & correction circuit 13 generates parity data from the received information data to output the received information data and the generated parity data to the page buffer 12. The page buffer 12 writes the received data in memory cells connected to a selected page as code data.

The control circuit 16 receives control signals to perform a control of program, read, erase and verification operations of data with respect to nonvolatile memory cells. The control signals may include, for example, an external clock signal, a chip enable signal (/CE), a read enable signal (/RE), a program enable signal (WE), a command latch enable signal (CLE), an address latch enable signal (ALE), a write protect signal (/WP), etc.

The control circuit 16 outputs an internal control signal to each circuit in response to an operation mode, which the control signal and command data being input from the I/O pad 15 indicate. The control circuit 16 reads command data from the I/O pad 15 to store it in an internal register in response to a command latch enable signal CLE transitioning to a high level from a low level at the beginning of a program enable signal (/WE).

The address decoder 17 stores and maintains an address (a row address, a block address and a column address) being input from the I/O pad 15 on the basis of an internal control signal from the control circuit 16. The address decoder 17 outputs the address being stored and maintained to the row and block decoder 18, the page buffer 12 and the error detection & correction circuit 13 on the basis of an internal control signal from the control circuit 16.

The control circuit 16 reads an address from the I/O pad 15 to store and maintain it in an internal register of the address decoder 17 in response to an address latch enable signal ALE transitioning to a high level from a low level at the beginning of a program enable signal (/WE).

The row and block decoder 18, in response to a row address and a block address which the address decoder 17 stores and outputs, selects a block and a word line of the memory cell array 11 to select memory cells of one page. The address decoder 17 performs a selection of a bit line of the memory cell array 11 and the page buffer 12 in response to a column address being maintained therein.

The error detection & correction circuit 13, when the nonvolatile semiconductor memory device 10 performs a data read operation, processes data read from the page buffer 12 by sector to calculate coefficients for an error location detection polynomial. The error detection & correction circuit 13, when the nonvolatile semiconductor memory device 10 performs a data read operation, corrects an error of data of every bit for which a location is indicated by a column address to output it to the outside through the I/O pad 15 as corrected data.

The error detection & correction circuit 13, when the nonvolatile semiconductor memory device 10 performs a data write operation, receives information data being input from the I/O pad 15 through the buffer 14. The error detection & correction circuit 13 generates parity data from the received information data to output the received information data and the generated parity data to the page buffer 12. The page buffer 12 writes the received data in memory cells connected to a selected page as code data.

Figure 2:
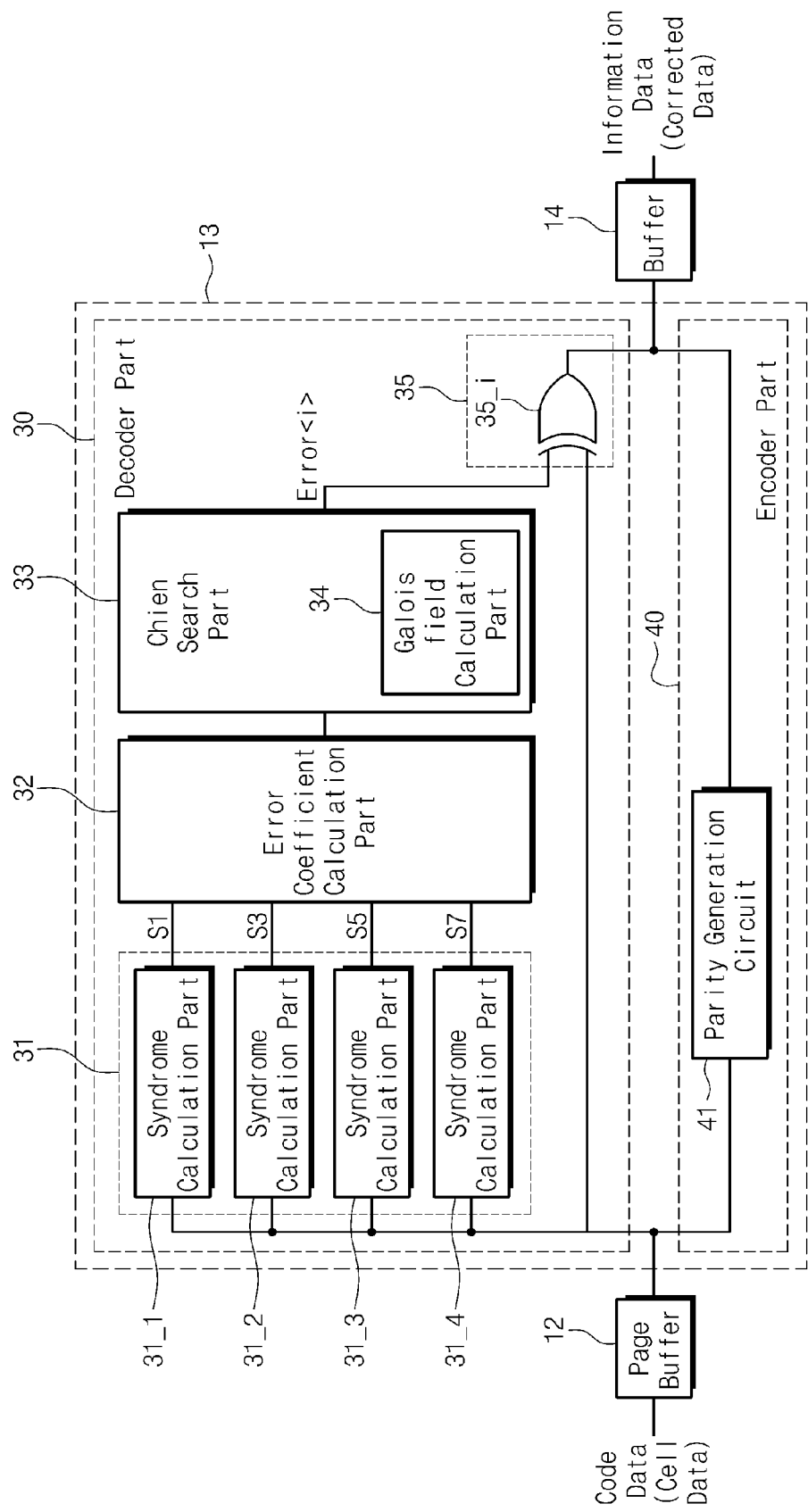
FIG. 2 illustrates an example of an error detection & correction circuit.

FIG. 2 illustrates an example of the error detection & correction circuit 13 in the NAND flash memory described above.

An error detection & correction circuit using BCH code is described as the error detection & correction circuit 13.

The error detection & correction circuit uses a block code using a Galois field arithmetic operation represented by a BCH code. In addition, the error detection & correction circuit may also use a modified example of BCH code, for example, a Hamming code and a Reed-Solomon code.

The error detection & correction circuit 13 includes a decoder unit 30 performing decoding of data and an encoder unit 40 generating parity data for correction and adding the parity data for correction to data being written in a cell.

The encoder unit 40 includes a parity generating circuit 41. The parity generating circuit 41 generates parity data by dividing information data written in the buffer 14 by a generating polynomial. The parity generating circuit 41 adds the generated parity data to the information data to output it to the page buffer 12. Data being output is code data being written in a selected one page when the nonvolatile semiconductor memory device 10 performs a data write operation. In some exemplary embodiments, when the nonvolatile semiconductor memory device 10 performs a data read operation, the error detection & correction circuit 13 performs a data correction process at high speed, using a reduced size Galois field arithmetic operation circuit 34 in the error detection & correction circuit 13.

The decoder unit 30 includes a syndrome calculation unit 31, an error coefficient calculation unit 32, a Chien search unit 33, and an error correction unit 35. The Galois field arithmetic operation circuit 34 is included in the Chien search unit 33.

The syndrome calculation unit 31, when the nonvolatile semiconductor memory device 10 performs a data read operation, receives cell data read from the page buffer 12 as code data and calculates syndromes by calculating the received code data in an independent minimum polynomial. In one embodiment, the number of independent minimum polynomials being used in a BCH code that can correct an error of 4 bit data is four. The syndrome calculation unit 31 includes four syndrome calculation circuits 31_1~31_4 corresponding to the four minimum polynomials. The four syndrome calculation circuits 31_1~31_4 calculate syndromes S1, S2, S3 and S4 respectively.

The error coefficient calculation unit 32 calculates coefficients of the error location detection polynomial using the syndromes S1, S2, S3 and S4. In the case that the error location detection polynomial is a four-degree polynomial ($P(X)=p4X4+p3X3+p2X2+p1X+p0$), the error coefficient calculation unit 32 calculates coefficients (p4, p3, p2, p1, p0). The Chien search unit 33 calculates the error location detection polynomial P(X) using the Galois field arithmetic operation circuit 34. Code data, for example, a value (factor of Galois field) indicating a bit location of cell data stored in the page buffer 12 is inputted into the error location detection polynomial P(X). When searching whether a bit read from the pager buffer 12 includes an error or not, the error location detection polynomial P(X) is used in the Chien search unit 33.

The Chien search unit 33 calculates an error location detection polynomial ($P(X)=p4X^4+p3X^3+p2X^2+p1X+p0$) in the Galois field arithmetic operation circuit 34. In one embodiment, in the case that a value of the error location detection polynomial (P(X)) is 0, the Chien search unit 33 outputs an error detection signal as an H level. In the case that a value of the error location detection polynomial (P(X)) is not 0, the Chien search unit 33 outputs an error detection signal as an L level.

In one embodiment, if a level of the error detection signal is high, the error correction unit 35 converts a logical value (0 or 1) of data of a bit of a corresponding location to output it as 1 bit of corrected data. If a level of the error detection signal is low, the error correction unit 35 does not convert a logical value (0 or 1) of data of a bit of a corresponding location to output it as 1 bit of corrected data.

When substituting x=α^I (a factor of Galois field: I is a location of bit line) into an error location detection polynomial ($P(X)=p4X^4+p3X^3+p2X^2+p1X+p0$) using the Galois field arithmetic operation circuit 34 in the Chien search unit 33, in the case that a value of the error location detection polynomial P(X) is 0, a level of the error detection signal (Error<i>) becomes high. In the case that a value of the error location detection polynomial P(X) is not 0, a level of the error detection signal (Error<i>) becomes low.

In one embodiment, the error detection signal (Error<i>) and a bit having a location of an ith bit line among cell data stored in the page buffer 12 by a read operation are inputt into the an exclusive OR operation circuit 35_i of the error correction unit 35. If a level of the error detection signal (Error<i>) is high, the exclusive OR operation circuit 35_i converts a logical value of data having a bit of location of an ith bit line to output it as 1 bit of corrected data. If a level of the error detection signal (Error<i>) is low, the exclusive OR operation circuit 35_i does not convert a logical value of data having a bit of location of an ith bit line to output it as 1 bit of corrected data.

Linearity which a Polynomial has and a Linear Structure which a Galois Field has In the nonvolatile semiconductor memory device 10 in accordance with some example embodiments, the error detection & correction circuit 13, when performing an arithmetic operation of an error location detection polynomial using the Galois field arithmetic operation circuit 34, reduces a circuit size using a linear structure which the Galois field and the polynomial have. Linearity which Galois field and the polynomial have will be described.

For brevity of description, examples will be discussed for which in a Galois field GF(2^m), m=3 (or m=4) and the degree of an error location detection polynomial is four (n=4). However, the values for m and n are not limited to these examples. The values m and n depend on a bit length and the number of error correction bits of data that becomes an object of detection.

When any function F(X) satisfies two conditions below, the function F(X) is linear with respect to X.

$$F(X1+X2)=F(X1)+F(X2) \qquad \text{Condition 1:}$$

$$F(aX1)=aF(X1) \qquad \text{Condition 2:}$$

If X is a factor of a Galois field, "$F(X)=X^2$" is a linear function of X. In the case that X1 and X2 are factors of a Galois field and a=1, 0, since F(X1+X2) satisfies a mathematic formula 1, the condition 1 is satisfied.

$$\begin{aligned} F(X1+X2) &= (X1+X2)^2 \qquad \text{[mathematical formula 1]}\\ &= X1^2 + 2X1X2 + X2^2\\ &= X1^2 + X2^2\\ &= F(X1)+F(X2) \end{aligned}$$

Addition on a Galois field is an exclusive OR and since 1+1=2=0, 2X1X2 is 0.

Since a=0, 1, the condition 2 is also satisfied. Similarly, from 1+1=0 in a Galois field, a function multiplying X the number of squares times, for example, X^4, X^8, X^16, ..., etc., is a linear function of Galois field.

By paying attention to first, second, and fourth sections of the Galois field polynomial, that combination described above is defined as Q(X) like a mathematical formula 2.

$$Q(X)=p4X^4+pX^2+p1X \qquad \text{[mathematical formula 2]}$$

When substituting X, Y into the mathematical formula 2 as a factor of Galois field, a mathematical formula 3 is made.

$$\begin{aligned}Q(X+Y) &= p4(X+Y) + p2(X+Y)2 + p1(X+Y)\\&= p4(X4+Y4) + p2(X2+Y2) + p1(X+Y)\\&= p4X4 + p4Y4 + p2X2 + p2Y2 + p1X + p1Y\\&= (p4X4 + p2X2 + p1X) + (p4Y4 + p2Y2 + p1Y)\\&= Q(X) + Q(Y)\end{aligned}$$

[mathematical formula 3]

Addition on the Galois field is an exclusive OR and since 1+1=2=0, 2X1X2 is 0.

According to the mathematical formula 3, since the condition 1 and the condition 2 are satisfied, Q(X) is a linear function.

Other sections (e.g., X3, X5) except X4, X2 and X may be regarded as a linear function by regarding them as variable. By paying attention to third, sixth, and twelfth sections, that combination described above is defined as R(X) like a mathematical formula 4.

$$R(X) = p12X12 + p6X6 + p3X3$$ [mathematical formula 4]

R(X) is a linear function.

An exemplary linear structure which a Galois field has will be described further below.

FIG. 3 illustrates $1(=\alpha^0), \alpha^1, \alpha^2, \ldots \alpha^{14}$ which is a factor of Galois field $GF(2^4)$ by a table 1 when a primitive polynomial F(X) is $F(X)=X^4+X+1$. Here, if considering four factors (part surrounded by a dotted line) of 1, $\alpha$, $\alpha^2$, $\alpha^3$, they are linear independencies which are not expressed by combinations of factors except themselves. If assuming them as a base vector, other factors are expressed by linear combination of base vectors. Using a relation of $\alpha^4+\alpha^1+\alpha^0=0$, each factor 0, $\alpha^0(=1), \alpha^1, \alpha^2, \ldots \alpha^{14}$ can be represented by four-dimensional vector $(0, 0, 0, 0)\sim(1, 1, 1, 1)$ with $\alpha^0, \alpha, \alpha^2, \alpha^3$ as factor.

Factors of a Galois field may be expressed by a mathematical formula 5.

$$\alpha^4 = 1 + \alpha^1$$

$$\alpha^{12} = \alpha(\alpha^1 + \alpha^2 + \alpha^3) = \alpha^2 + \alpha^3 + \alpha^4 = 1 + \alpha^1 + \alpha^2 + \alpha^3 \text{ [mathematical formula 5]}$$

If assuming that $\beta i = 0, 1$ (i=0, 1, 2, 3), an arbitrary factor may be expressed by a mathematical formula 6.

$$\alpha^j = \beta3\alpha^3 + \beta2\alpha^2 + \beta1\alpha^1 + \beta0\alpha^0, (j=0,1,2,\ldots) \text{ [mathematical formula 6]}$$

Here, $\beta3, \beta2, \beta1, \beta0$ are vector expression corresponding to $\alpha j$.

In Q(X) of the mathematical formula 2, Qj is defined as $Q(\alpha^j)$ (j=0, 1, 2, . . . ). If substituting the mathematical formula 6 into Q(X) of the mathematical formula 2, a mathematical formula 7 is made.

[mathematical formula 7]

$$\begin{aligned}Qj &= Q(\alpha^j) & (a)\\&= Q(\beta3\alpha^3 + \beta2\alpha^2 + \beta1\alpha^1 + \beta0\alpha^0)\\&= \beta3Q(\alpha^3) + \beta2Q(\alpha^2) + \beta1Q(\alpha^1) + \beta0Q(\alpha^0)\\&\text{((due to linearity of } Q(X))\\&= \beta3Q3 + \beta2Q2 + \beta1Q1 + \beta0Q0 & (b)\end{aligned}$$

In the conventional case, on the basis of the (a) formula, it is necessary to add a result of performing a matrix operation on each section as $Qj = p4\alpha^4 + p2\alpha^2 + p1\alpha$. In some example embodiments, using the (b) formula, Q0, Q1, Q2, Q3 corresponding to base $1(=\alpha^0), \alpha^1, \alpha^2, \alpha^3$ are obtained by a matrix operation in advance and other Qj may be obtained by a simple addition.

FIG. 4 illustrates $(1(=\alpha^0), \alpha^2, \ldots, \alpha^6)$ which are factors of a Galois field $GF(2^3)$ by a table 2 when a primitive polynomial F(X) is $F(X)=X^3+X+1$. Here, if considering three factors (part surrounded by a dotted line) of 1, $\alpha$, $\alpha^2$, they are linear independencies which are not expressed by combinations of factors except themselves. If assuming them as a base vector, other factors are expressed by linear combination of base vectors. Using a relation of $\alpha^3+\alpha^1+\alpha^0=0$, each factor 0, $\alpha^0(=1), \alpha^1, \alpha^2, \ldots, \alpha^6$ can be represented by three-dimensional vector $(0, 0, 0)\sim(1, 1, 1)$ with $\alpha^0, \alpha, \alpha^2$ as factor.

Constitution of the Galois Field Arithmetic Operation Circuit 34

A constitution of Galois field arithmetic operation circuit 34 finding a zero point of a Galois field polynomial (an error location detection polynomial) will be described below. The Galois field arithmetic operation circuit 34 is configured to reduce a circuit size using linearity, which the error location detection polynomial has, and a linear structure, which Galois field has. The Galois field arithmetic operation circuit 34 reduces a circuit size by performing an arithmetic operation on a linear function, combining sections constituting a same linear space using a base calculation unit and a linear development unit that will be described later, when performing an arithmetic operation on the error location detection polynomial P(X).

Figure 5A:
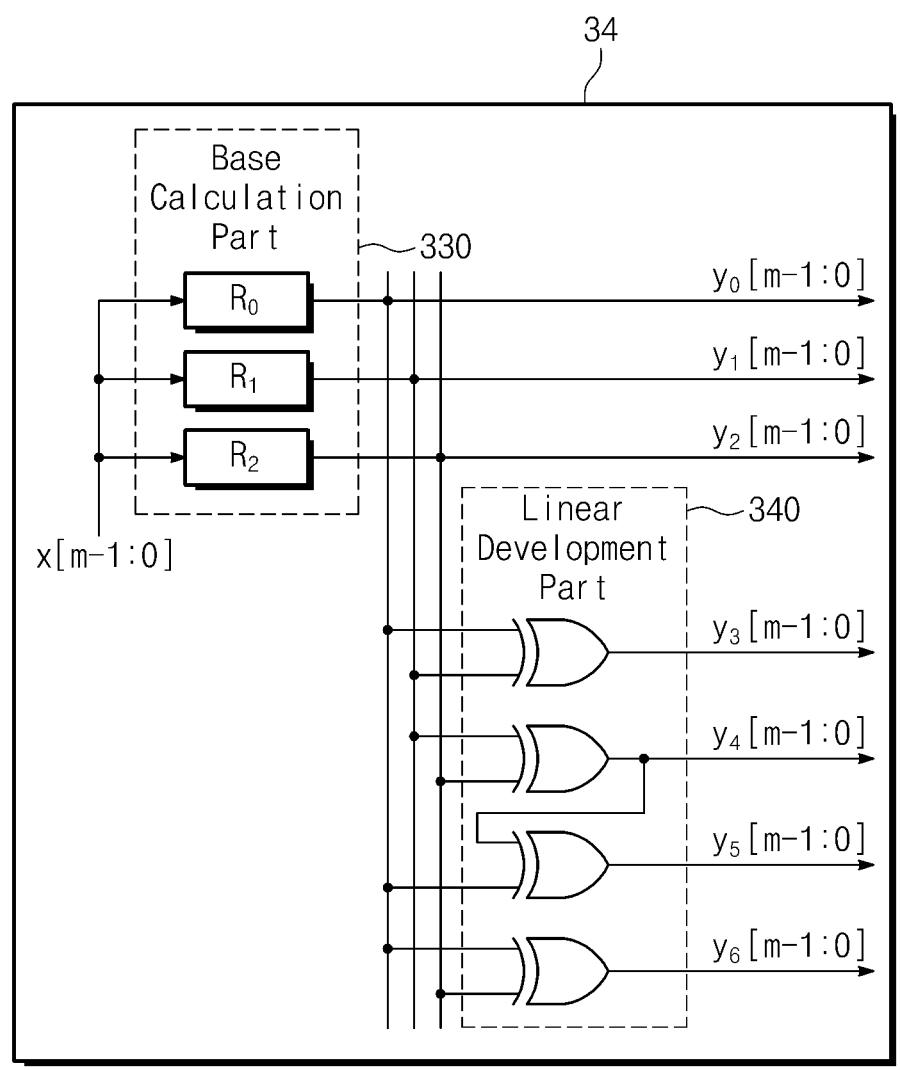
FIGS. 5A and 5B illustrate examples of constitution of a Galois field arithmetic operation circuit.

FIG. 5A illustrates an example of constitution of the Galois field arithmetic operation circuit 34 when m=3. The Galois field arithmetic operation circuit 34 includes a base calculation unit 330 and a linear development unit 340. The base calculation unit 330 includes three arithmetic operation units R0, R1 and R2 and the linear development unit 340 includes four EXOR devices. In the Galois field arithmetic operation circuit 34 illustrated in FIG. 5A, the base calculation unit 330 calculates a linear function (y) corresponding to factors which are base among the factors x (m−1: 0) by a matrix operation and the linear development unit 340 adds calculation results of the base calculation unit 330 to obtain an output of a linear function (y) corresponding to the other factors other than the factors which are base factors.

In the Galois field arithmetic operation circuit 34, the base calculation unit 330 calculates bases with respect to a linear function included in the error location detection polynomial and the linear development unit 340 outputs all the values which X of the linear function can take at the same time by a simple addition of calculation results of the bases. As a result, the Galois field arithmetic operation circuit 34 can reduce a circuit size by converting a matrix operation unit (using about m (m−1)/2 EXOR devices) into a simple addition unit (using m−1 EXOR devices) with respect to the number $2^m-1-m$ obtained by subtracting the number m of bases from the number $2^m-1$ of the value which X can take.

Figure 5B:
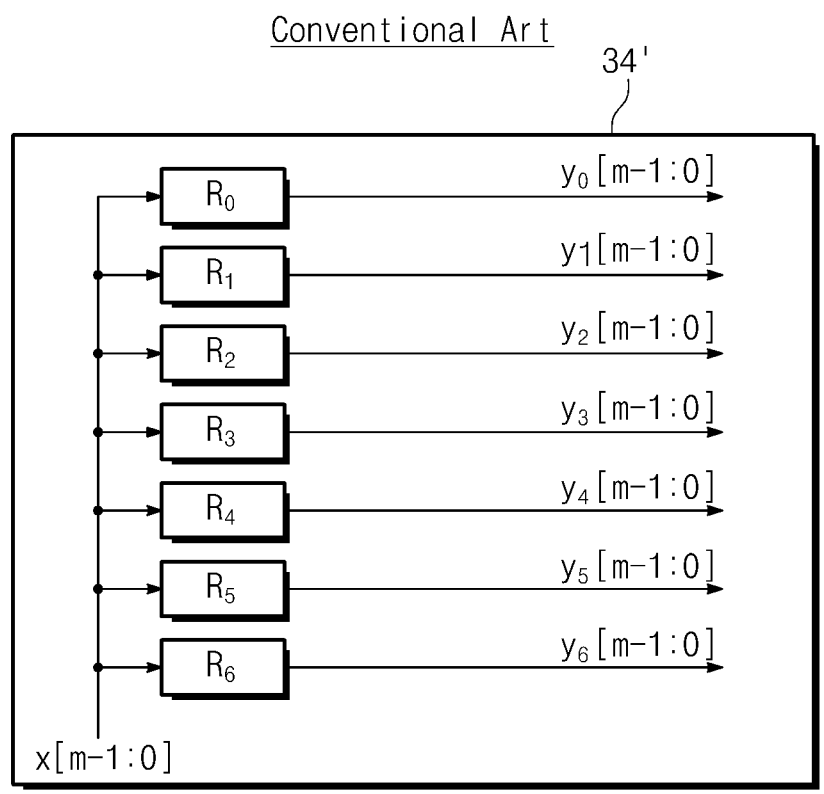

FIG. 5B illustrates a constitution of a conventional Galois field arithmetic operation circuit 34'. In the conventional Galois field arithmetic operation circuit 34', seven parallel arithmetic operation circuits R0~R6 corresponding to each X factor are prepared and signals (y0, y1, y2, . . . , y6) are operated by the seven parallel arithmetic operation circuits R0~R6 at the same time.

Figures 6A, 6B, 7:
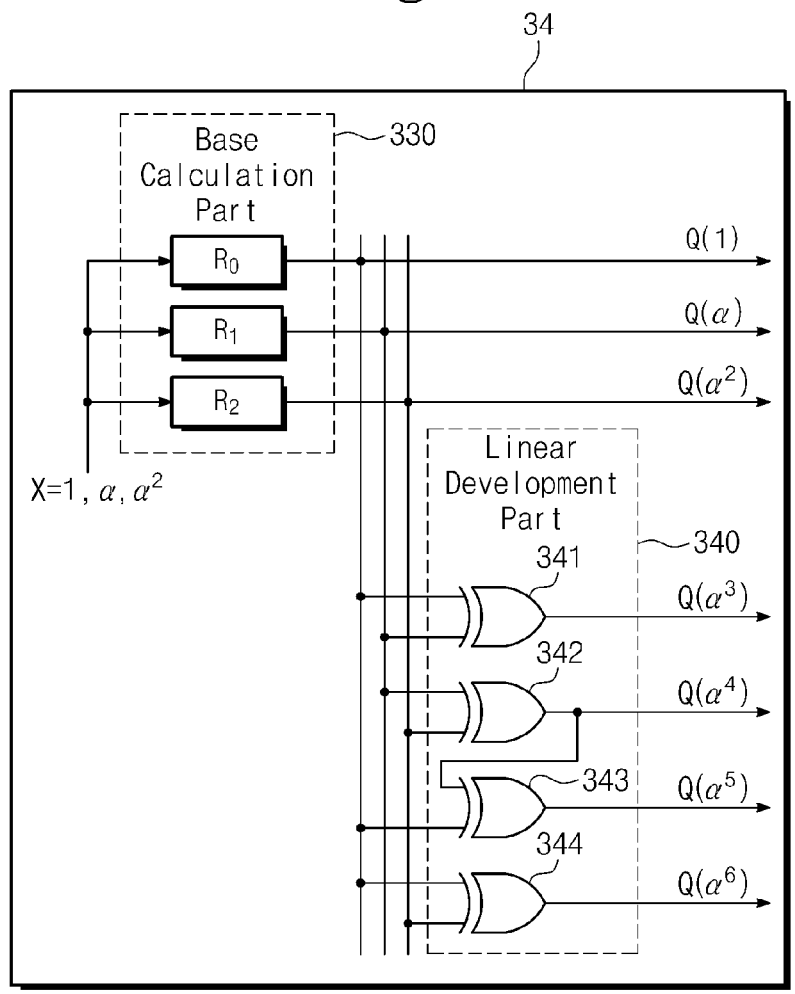
FIGS. 6A and 6B illustrate examples of a linear structure of a polynomial.
FIG. 7 is an exemplary drawing for explaining an arithmetic operation of the Galois field arithmetic operation circuit illustrated in FIG. 5A.

In the case that a fourth degree error location detection polynomial is "$P(X)=p4X^4+p3X^3+p2X^2+p1X^1+p0$", the conventional Galois field arithmetic operation circuit 34', as illustrated in FIG. 6A, performs an arithmetic operation at every section ($piX^i$). On the other hand, the Galois field arithmetic operation circuit 34, as illustrated in FIG. 6B, combines a section having a same linear structure with respect to X with a polynomial (a linear function "Q(X)= p4X^4+p2X^2+p1X").

With respect to a linear function "Q(X)=p4X^4+p2X^2+ p1X", an arithmetic operation is performed by the base calculation unit 330 and the linear development unit 340 in the Galois field arithmetic operation circuit 34 illustrated in FIG. 5A and in an arithmetic operation of the error location detection polynomial P(X), the number of units calculating each section is reduced and the number of circuit devices adding an output between units is also reduced. Sections "p3X^3" and "P0" except Q(X) (e.g., the sections of the error location detection polynomial not included in the linear function Q(X)) are separately calculated in a circuit (not shown) in the Galois field arithmetic operation circuit 34, and then are added to an operation result of "Q(X)=p4X^4+p2X^2+p1X".

FIG. 7 is an exemplary drawing for explaining an arithmetic operation of the Galois field arithmetic operation circuit 34 illustrated in FIG. 5A. In the Galois field arithmetic operation circuit 34 illustrated in FIG. 7, a factor X which is 1, α, α^2 is input into the base calculation unit 330. A linear function Q(1), Q(α), Q(α^2) corresponding to the X is calculated by the base calculation unit 330 and Q(α^3), Q(α^4), Q(α^5), Q(α^6) are calculated by the linear development unit 340.

As illustrated in FIG. 7, the Galois field arithmetic operation circuit 34 includes the base calculation unit 330 and the linear development unit 340. The base calculation unit 330 includes three arithmetic operation units R0, R1 and R2 and the linear development unit 340 includes four EXOR devices 341, 342, 343 and 344.

The arithmetic operation unit R0 in the base calculation unit 330 calculates a linear function (Q(1)=p4 1^4+p2 1^2+p1 1^1) in an error location detection polynomial corresponding to factor X (1=α^0) by a matrix operation. The arithmetic operation unit R1 calculates a linear function (Q(α)=p4α^4+ p2α^2+p1α^1) corresponding to factor X (=α^1=α) by a matrix operation. The arithmetic operation unit R2 calculates a linear function (Q(α^2)=p4(α^2)^4+p2(α^2)^2+p1α^2) corresponding to factor X X(=α2) by a matrix operation.

The linear development unit 340 develops an arithmetic operation result (Q(1), Q(α), Q(α^2)) calculated by the base calculation unit 330 by a simple addition to obtain a different output. For example, in Q(α^3), as illustrated in the table 2 of the Galois field GF(2^3) of FIG. 4, since "α^3=α+1", it is developed to "Q(α^3)=Q(α)+Q(1)" by the linearity described above. Thus, Q(α^3) may be obtained by adding outputs Q(1) and Q(α) of the base calculation unit 330 using the EXOR device (adder) 341.

In Q(α^4), as illustrated in the table 2 of the Galois field GF(2^3) of FIG. 4, since "α^4=α^2+α", it is developed to "Q(α^4)=Q(α^2)+Q(α)" by the linearity described above. Thus, Q(α^4) may be obtained by adding outputs Q(α) and Q(α^2) of the base calculation unit 330 using the EXOR device (adder) 342.

In Q(α^5), since "α^5=α^2+α+1" and, "α^4=α^2+α", "α^5=α^4+1". Thus, Q(α^5) may be obtained by adding an output Q(1) of the base calculation unit 330 and an output Q(α^4) of the EXOR device 342 using the EXOR device (adder) 343. Similarly, in Q(α^6), since "α^6=α^2+1", Q(α^6) may be obtained by adding outputs Q(1) and Q(α^2) of the base calculation unit 330 using the EXOR device (adder) 344.

In case of the Galois field GF(2^3), in one embodiment, the base calculation unit 330 calculates three linear functions Q(1), Q(α^1), Q(α^2) corresponding to three linear independent elements (1, α^1, α^2). The linear development unit 340 can calculate linear functions Q(α^3), Q(α^4), Q(α^5), Q(α^6) by performing an add operation using an EXOR device on the basis of an arithmetic operation result of Q(1), Q(α^1), Q(α^2) of the base calculation unit 330. The Galois field arithmetic operation circuit 340 reduces a circuit size by converting a matrix operation into a simple addition with respect to four error location detection polynomials (a linear function in the error location detection polynomial) obtained by subtracting three bases from the whole seven bases which the Galois field factor X can take.

The bases of vector expressions 001, 010 and 100 illustrated in the table 2 of FIG. 4 are used as the three linear independent bases illustrated in FIG. 7. However, the bases used as the three linear independent bases do not need to include only one "1" bit. If satisfying a condition of a linear independent vector, any vectors may be selected as the bases.

The Galois field arithmetic operation circuit 34 combines sections constituting a same linear space with respect to an error location detection polynomial as a linear function and performs an arithmetic operation on the combined linear function using the base calculation unit 330 and the linear development unit 340. Accordingly, the Galois field arithmetic operation circuit 34 can greatly reduce a size of an arithmetic operation device needed when performing an error location detection polynomial. The number of units calculating each section of the error location detection polynomial is reduced and thereby the number of circuit devices adding an output between units is also reduced.

The Case where an Error Location Detection Polynomial Includes Linear Function of X2 and X3

In some of the example embodiments described above, the Galois field arithmetic operation circuit 34 calculates a linear function (Q(X)=p1X^4+p2x^2+p1X) corresponding to X. Below, an example of a case where an error location detection polynomial (Λ(X)) includes a linear function corresponding to X and a linear function corresponding to X^3 is described.

In the case where the error location detection polynomial (Λ(X)) is expressed by "P(X)=σ1X+σ2X^2+ σ4X^4+ . . . +σ3X^3+σ6X^6+σ12X^12+ . . . ", by combining a linear function (M(X)=σ1X+σ2X^2+σ4X^4+ . . . ) with X and combining a linear function (N(X)=σ3X^3+σ6X^6+ σ12X^12+ . . . ) with X^3, an arithmetic operation can be individually performed on each linear function.

FIG. 8 illustrates an example of a circuit calculating a linear section with respect to X.

In FIG. 8, as in the circuit illustrated in FIG. 5A, a base calculation unit 400 includes three arithmetic operation units 401, 402 and 403 and a linear development unit 410 includes four EXOR devices 411, 412 and 413.

The base calculation unit 400 calculates M(α^0) using the arithmetic operation unit 401, calculates M(α^1) using the arithmetic operation unit 402 and calculates M(α^2) using the arithmetic operation unit 403. The arithmetic operation unit 401 calculates an error location detection polynomial (M(X)= σ1 1+σ2 1^2+σ4 1^4+ . . . ) with respect to factor X(1=α^0) by a matrix operation. The arithmetic operation unit 402 calculates an error location detection polynomial (M(X)=σ1α+ σ2α^2+σ4α^4+ . . . ) with respect to factor X(=α^1=α) by a matrix operation. The arithmetic operation unit 403 calculates an error location detection polynomial (M(X)=σ1 (α^2)+σ2(α^2)^2+σ4(α^2)^4+ . . . ) with respect to factor X(=α^2) by a matrix operation.

The linear development unit 410 calculates M(α^3), M(α^4), M(α^5), M(α^6) by developing an arithmetic operation result calculated by the base calculation unit 400 to a simple addition using the EXOR devices 411, 412, 413, and 414.

In $M(\alpha^3)$, as illustrated in the table 2 of Galois field $GF(2^3)$ of FIG. 4, since "$\alpha^3=\alpha+1$", by the linearity described above, it is developed to "$M(\alpha^3)=M(\alpha)+M(\alpha^0=1)$". Thus, $M(\alpha^3)$ may be obtained by adding outputs $M(\alpha^0=1)$ and $M(\alpha)$ of the base calculation unit 400 using the EXOR device (adder) 411.

In $M(\alpha^4)$, as illustrated in the table 2 of Galois field $GF(2^3)$ of FIG. 4, since "$\alpha^4=\alpha^2+\alpha$", by the linearity described above, it is developed to "$M(\alpha^4)=M(\alpha^2)+M(\alpha)$". Thus, $M(\alpha^4)$ may be obtained by adding outputs $M(\alpha)$ and $M(\alpha^2)$ of the base calculation unit 400 using the EXOR device (adder) 412.

In $M(\alpha^5)$, since "$\alpha^5=\alpha^2+\alpha+1$" and "$\alpha^4=\alpha^2+\alpha$", "$\alpha^5=\alpha^4+1$". Thus, $M(\alpha^5)$ may be obtained by adding an output $M(\alpha^0=1)$ of the base calculation unit 400 and an output $M(\alpha^4)$ of the EXOR device 412 using the EXOR device 413.

Similarly, in $M(\alpha^6)$, since "$\alpha^6=\alpha^2+1$", $M(\alpha^6)$ may be obtained by adding outputs $M(\alpha^0=1)$ and $M(\alpha^2)$ of the base calculation unit 400 using the EXOR device (adder) 414.

Thus, in the Galois field arithmetic operation circuit 34, a size of an arithmetic operation circuit with respect to a linear function ($\sigma 1X+\sigma 2X^2+\sigma 4X^4+\ldots$) may be reduced.

An arithmetic operation of a function ($N(X)=\sigma 3X^3+\sigma 6X^6+\sigma 12X^{12}+\ldots$) with respect to $X^3$ is described. FIG. 9 illustrates a thing that cubed the element (element illustrated in the table 2) of Galois field $GF(2^3)$ when a primitive polynomial illustrated in FIG. 4 is "$X^3+X+1$" by a table 3. In this case, in FIG. 9, part ($1, \alpha^3, \alpha^6$) surrounded by a dotted line is a base and elements ($\alpha^9, \alpha^{12}, \alpha^{15}, \alpha^{18}$) except the part ($1, \alpha^3, \alpha^6$) surrounded by a dotted line may be expressed by combination of bases.

Figure 10:
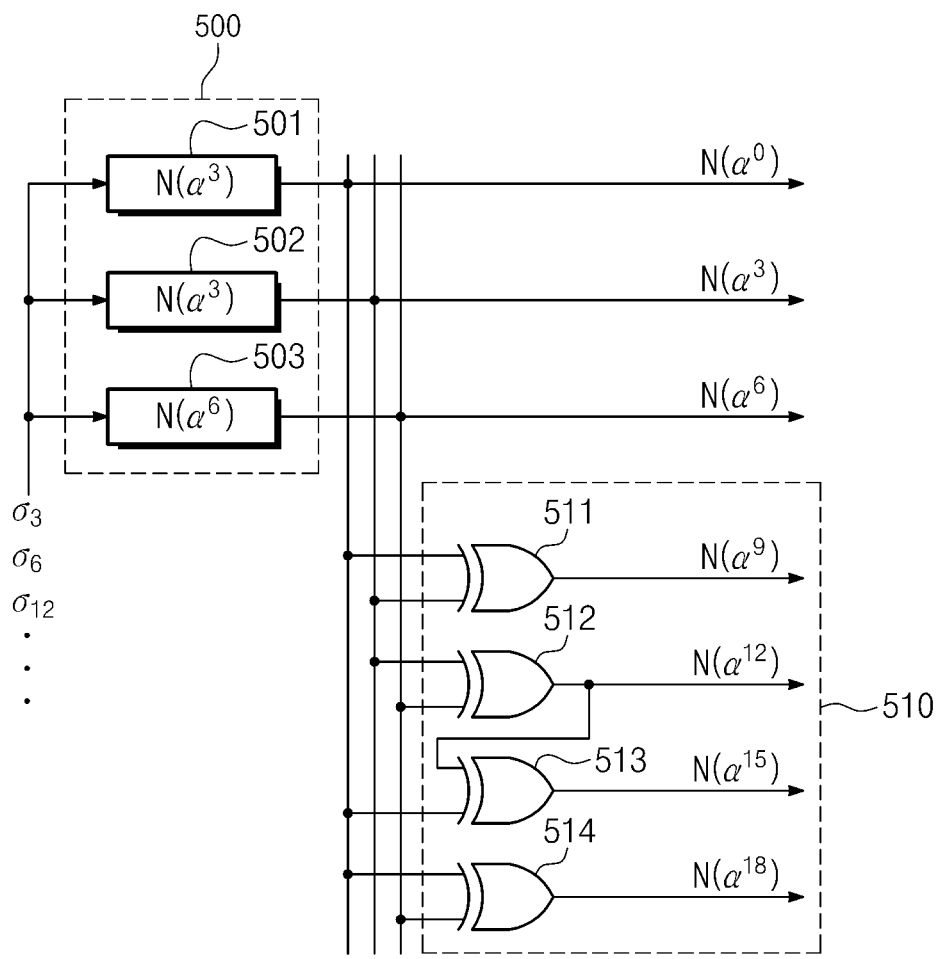
FIG. 10 illustrates an example of a circuit calculating a linear section with respect to $X^3$.

Thus, in some example embodiments, a linear function ($N(X)=\sigma 3X^3+\sigma 6X^6+\sigma 12X^{12}+\ldots$) obtained by arranging a section of $X^3, X^6, X^{12}, \ldots$, as illustrated in FIG. 10, is operated by a base calculation unit 500 and a linear development unit 510. A circuit pattern developing a base in the linear development unit 510 is different from that in FIG. 8. This is because with respect to $N(X)$, when $Y=X^3$, the $N(X)$ becomes a linear function by "$N(Y)=\sigma 3Y+\sigma 6Y^2+\sigma 12Y^4+\ldots$" and thereby a value which Y can have can be more and more expressed by addition of the bases illustrated in the table 3 of FIG. 9. Since a calculation by development of bases is performed regarding $N(X)$ as not a nonlinear function of X but a linear function regarding $X^3$ as variable, a circuit reduction effect equal to the circuit illustrated in FIG. 8 is obtained.

In an example illustrated in FIG. 10, with respect to a polynomial ($N(X)=\sigma 1X^3+\sigma 6X^6+\sigma 12X^{12}+\ldots$), $N(\alpha^0)$ is calculated by a matrix operation using the arithmetic operation unit 501 in the base calculation unit 500, $N(\alpha^3)$ is calculated by a matrix operation using the arithmetic operation unit 502 in the base calculation unit 500 and $N(\alpha^6)$ is calculated by a matrix operation using the arithmetic operation unit 503 in the base calculation unit 500. The linear development unit 510 calculates $N(\alpha^9)$, $N(\alpha^{12})$, $N(\alpha^{15})$, $N(\alpha^{18})$, ... using the EXOR devices 511, 512, 513 and 514 on the basis of operation results of bases calculated by the base calculation unit 500.

In $N(\alpha^9)$, as illustrated in the table 3 of FIG. 9, since "$\alpha^9=\alpha^6+1$", by the linearity described above, it can be developed to "$N(\alpha^9)=N(\alpha^6)+N(\alpha^0=1)$". Thus, $N(\alpha^9)$ may be obtained by adding outputs $N(\alpha^0=1)$ and $N(\alpha^6)$ of the base calculation unit 500 using the EXOR device (adder) 511.

In $N(\alpha^{12})$, as illustrated in the table 3 of FIG. 9, since "$\alpha^{12}=\alpha^6+\alpha^3+1$" and "$\alpha^9=\alpha^6+1$", "$\alpha^{12}=\alpha^9+\alpha^3$". Thus, by the linearity described above, it can be developed to "$N(\alpha^{12})=N(\alpha^9)+N(\alpha^3)$". The $N(\alpha^{12})$ may be obtained by adding an output $N(\alpha^3)$ of the base calculation unit 500 and an output $N(\alpha^9)$ of the EXOR device 512 using the EXOR device (adder) 512.

In $N(\alpha^{15})$, "$\alpha^{15}=\alpha^3+1$". Thus, by the linearity described above, $N(\alpha^{15})$ may be obtained by adding outputs $N(\alpha^0=1)$ and $N(\alpha^3)$ of the base calculation unit 500 using the EXOR device (adder) 513.

Similarly, in $N(\alpha^{18})$, since "$\alpha^{18}=\alpha^6+\alpha^3$", $N(\alpha^{18})$ may be obtained by adding outputs $N(\alpha^6)$ and $N(\alpha^3)$ of the base calculation unit 500 using the EXOR device (adder) 514.

Accordingly, in the Galois field arithmetic operation circuit 34, a circuit size may be reduced when performing an arithmetic operation on a linear function ($N(X)=\sigma 3X^3+\sigma 6X^6+\sigma 12X^{12}+\ldots$).

As described above, in the error detection & correction circuit 13, the Galois field arithmetic operation circuit 34 includes a base calculation unit calculating a base and a linear development unit developing a base by a simple addition.

In the Galois field arithmetic operation circuit 34, after a coefficient $pi(i=0, 1, 2, \ldots)$ of Galois field polynomial $P(X)$ is fixed, the base calculation unit 330 calculates bases with respect to each linear function included in the error location detection polynomial $P(X)$ and the linear development unit 340 can output all the values which X of the $P(X)$ can take by a simple addition of the bases at the same time. Thus, a circuit size of the Galois field arithmetic operation circuit 34 is reduced.

As illustrated in FIGS. 8 and 10, the number of units calculating sections of a polynomial is reduced by combining and calculating sections having a same linear structure and the number of devices of circuit adding outputs between units is also reduced.

An Example of a Reduction Effect of the Number of Devices According to One Embodiment A case of conventional art (e.g., a case of the Galois field arithmetic operation circuit 34' of FIG. 5B) and a case of the Galois field arithmetic operation circuit 34 in accordance with some example embodiments are compared with each other by calculating the number of devices used in a circuit finding a zero point of an mth degree polynomial $P(X)$ having a coefficient $(pi(i=0, 1, 2, \ldots))$ and variable (X) as a factor of Galois field $GF(2^m)$.

In the case of conventional art, a matrix operation circuit that needs about $m(m-1)/2$ number of EXOR devices is needed $2m-1$ and those are needed $n+1$ corresponding to the number of sections of a polynomial. Also, a circuit that needs m number of EXOR devices for adding each section is needed $2^m-1$ and those are needed n. The total number of devices necessary for the circuit is $(n+1)\times(2^m-1)\times m(m-1)/2+n\times(2^m-1)\times m$.

The Galois field arithmetic operation circuit 34 in accordance with some example embodiments needs only m number of matrix operation circuits that need about $m(m-1)/2$ number of EXOR devices and a unit developing an operation result of the base calculation unit to determine other values needs $m\times"2^m-1-m"$ number of EXOR devices. A function such as "$X^2, X^4, X^8, X^{16}, \ldots$" multiplying X by the number of Becky powers of 2 is a linear function of Galois field and since a linear combination among linear functions is also a linear function, that section can be combined. Similarly, "X^3, X^6, X^12, ...", "X^5, X^10, X^20, ..." can be combined.

The number of linear functions after combination is equal to the number of odds lower than n which is the degree of polynomial. If considering an integer section (p0), the number of units needed after combination increases such that when n=0, the number of units is 1 (0), when n=1, the number of units is 2 (0, 1), when n=2, the number of units is 2 (0, 1), when n=3, the number of units is 3 (0, 1, 3), when n=4, the number of units is 3 (0, 1, 3) and when n=5, the number of units is 4 (0, 1, 3, 5).

The number of units is n/2+1 when n is an even number and is (n+1)/2+1 when n is an odd number. If considering that the base calculation unit is not a combination object, the number of devices necessary for the circuit may be represented by a mathematical formula 8 when n is an even number and a mathematical formula 9 when n is an odd number.

$$(n+1) \times m \times m(m-1)/2 + m \times m \times n + (n/2+1)(2^m-1-m) \times m + (2^m-1-m)n/2 \quad \text{[mathematical formula 8]}$$

$$(n+1) \times m \times m(m-1)/2 + m \times m \times n + (n+1)/2 + 1(2^m-1-m) \times m + (2^m-1-m)(n+1)/2 \quad \text{[mathematical formula 9]}$$

In FIG. 11A, in case of n=4 (n is the degree of the polynomial), an example is illustrated which compares the total number of devices of the conventional art (the conventional Galois field arithmetic operation circuit 34' of FIG. 5B) and the embodiments such as described herein.

In FIG. 11B, in case of n=8, an example is illustrated which compares the total number of devices of the conventional art (the conventional Galois field arithmetic operation circuit 34' of FIG. 5B) and the embodiments described herein. According to an increase of parameter m characterizing the Galois field, the disclosed embodiments suppress an increase of circuit size as compared with the conventional case.

Effectiveness in addition to reduction of circuit size is also achieved by the disclosed embodiments. For example, a circuit structure of the linear development unit 340 illustrated in FIG. 5A has an independent form with respect to each bit of data to be handled. The linear development unit 340 may be embodied by m number of circuits wherein the circuit corresponds to 1 bit. Accordingly, a layout area of a circuit can be easily reduced.

A linear development unit corresponding to 1 bit is a circuit of "m input/2m-1 output". A part corresponding to m bits is a circuit of output of "2^m-1th power of m^2 input/2" and it is difficult to verify all input/output patterns in real time. Since unifying 1 bit portion is a circuit of "m input/2m-1 output", it is possible to verify all input/output patterns in real time. A more accurate verification can be performed by verifying all the input/output patterns and connections of higher levels using the unit. Since the linear development unit 340 can be divided into m number of units, a constitution in which an output from 1 unit is stored and a final result is obtained by clocking m times can be obtained. In this case, until a zero point is obtained, clocking m times is needed but a circuit size can be reduced to about 1/m of previously-described embodiments.

In the embodiments described above, the Galois field arithmetic operation circuit corresponds to the Galois field arithmetic operation circuit 34 in Chien search unit 33 illustrated in FIG. 2 and the memory device corresponds to the nonvolatile semiconductor memory device (NAND flash memory EEPROM) 10 illustrated in FIG. 1. The base calculation unit corresponds to the base calculation unit 330 illustrated in FIG. 5 and the linear development unit corresponds to the linear development unit 340.

The error detection & correction circuit corresponds to the error detection & correction circuit 13 illustrated in FIG. 2, the syndrome calculation unit corresponds to the syndrome calculation unit 31 in the decoder unit 30 illustrated in FIG. 2, the error coefficient calculation unit corresponds to the error coefficient calculation unit 32, the Chien search unit corresponds to the Chien search unit 33 and the error correction unit corresponds to the error correction unit 35.

In the embodiments described above, the Galois field arithmetic operation circuit 34 is a Galois field arithmetic operation circuit substituting $2^m-1$ number of elements vector-expressed by m bits (m is an integer) of a Galois field $GF(2^m)$ into an error location detection polynomial and includes the base calculation unit 330 calculating m linear independent elements out of the $2^m-1$ elements and the linear development unit 340 obtaining the remaining $2^m-1-m$ elements of the $2^m-1$ elements by a combination of the m elements.

The Galois field arithmetic operation circuit 34 includes the base calculation unit 330 and the linear development unit 340. The base calculation unit 330 calculates an error location detection polynomial with respect to m linear independent elements of Galois field $GF(2^m)$. When calculating an error location detection polynomial corresponding to $2^m-1-m$ elements except the m linear independent elements, a calculation is performed by adding operation results of the base calculation unit 330 and the linear development unit 340. In case of Galois field $GF(2^3)$, the base calculation unit 330 calculates $Q(1)$, $Q(\alpha^1)$, $Q(\alpha^2)$ from three linear independent elements $(1, \alpha^1, \alpha^2)$ with respect to a linear function of X of an error location detection polynomial ($P(X)=p4X^4+p3X^3+p2X^2+p1X^1+p0$), for example, "$Q(X)=p4X^4+p2X^2+p1X$". The linear development unit 340 calculates an operation result $Q(1)$, $Q(\alpha^1)$, $Q(\alpha^2)$ by an addition using EXOR device 341, 342 and 343 on the basis of an operation result $Q(1)$, $Q(\alpha^1)$, $Q(\alpha^2)$ with respect to a linear function $Q(\alpha^3)$, $Q(\alpha^4)$, $Q(\alpha^5)$, $Q(\alpha^6)$ corresponding to $(\alpha^3, \alpha^4, \alpha^5, \alpha^6)$.

The Galois field arithmetic operation circuit 34 can reduce a circuit size by transforming a conventional matrix operation to a simple addition.

In the embodiments described above, the Galois field arithmetic operation circuit 34 combines sections constituting a same linear space in an error location detection polynomial as a linear function and the combined linear function is operated using the base calculation unit 330 and the linear development unit 340. The Galois field arithmetic operation circuit 34 combines sections having a same linear space in an error location detection polynomial to calculate them. Thus, by combining sections having a same linear space in an error location detection polynomial to calculate them, the number of units calculating sections of polynomial is reduced and the number of circuits operating an output between units is also reduced.

In the embodiments described above, the memory device (nonvolatile semiconductor memory device 10) operates an error location detection polynomial using the Galois field arithmetic operation circuit 34 and has an error correction circuit performing an error detection of data column being input. The error detection & correction circuit 13 includes the syndrome calculation unit 31 calculating a syndrome from a data column, the error coefficient calculation unit 32 calculating a coefficient of the error location detection polynomial using the syndrome, the Galois field arithmetic operation circuit 34 performing an operation by substituting a value and a coefficient representing a bit location of data of a data column into an error location detection polynomial, the Chien search unit 33 outputting an error detection signal indicating whether or not an error exists in every bit of the data column in response to a substitution result of the error location detection polynomial and the error correction unit 35 correcting an error of data of a bit in the data column by the error detection signal to output the corrected data.

The memory device (nonvolatile semiconductor memory device 10), when operating an error location detection polynomial in the Galois field arithmetic operation circuit 34, calculates the error location detection polynomial with respect to m number of linear independent elements on a Galois field $GF(2^m)$. The linear development unit 340 generates an error location detection polynomial corresponding to $2^m-1-m$ number of elements except the m number of linear independent elements by adding the operation result on the basis of an operation result of the base calculation unit 330. Thus, a circuit size of the Galois field arithmetic operation circuit 34 mounted on the memory device (nonvolatile semiconductor memory device 10) may be reduced. The memory device (nonvolatile semiconductor memory device 10) can mount an error detection & correction circuit that can perform a high speed operation thereon in an on-chip form.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A Galois field arithmetic operation circuit substituting $2^m-1$ elements, where m is an integer, expressed by m bits of Galois field $GF(2^m)$ comprising:
    a base calculation circuit including m parallel arithmetic operation circuits, each of the m parallel arithmetic operation circuits configured to calculate one of m linear independent elements from the $2^m-1$ elements; and
    a linear development circuit configured to calculate a remaining $2^m-1-m$ elements not included in the calculated m linear independent elements by respective combination of each of the m linear independent elements,
    wherein the $2^m-1$ elements are calculated using a first number of EXOR devices, the first number of EXOR devices being less than a second number of EXOR devices used to calculate the $2^m-1$ elements in another Galois field arithmetic operation circuit that includes $2^m-1$ parallel arithmetic operation circuits configured to calculate the same $2^m-1$ elements.

2. The Galois field arithmetic operation circuit of claim 1, wherein the base calculation circuit and the linear development circuit are configured to perform an arithmetic operation on a combined linear function, and wherein sections constituting a same linear space with respect to an error location detection polynomial are combined to generate the combined linear function.

3. The Galois field arithmetic operation circuit of claim 2, wherein other sections besides the sections constituting the same linear space are developed based on the arithmetic operation that is performed by the base calculation circuit and the linear development circuit.

4. A memory device comprising an error correction circuit performing an error detection of data columns being input, wherein the error correction circuit comprises:
    a syndrome calculation circuit calculating a syndrome from a data column being input;
    an error coefficient calculation circuit calculating a coefficient of an error location detection polynomial from the syndrome;
    a Galois field arithmetic operation circuit performing an arithmetic operation by substituting a value representing a location of a bit of data of the data column and the coefficient into the error location detection polynomial;
    a Chien search circuit outputting an error detection signal indicating whether or not an error exists in each bit of the data column in response to a substitution result of the error location detection polynomial; and
    an error correction circuit correcting an error of data of a bit of the data column to output the corrected data in response to the error detection signal;
    wherein the Galois field arithmetic operation circuit is configured to substitute $2^m-1$ elements, where m is an integer, expressed by m bits of a Galois field $GF(2^m)$, and
    wherein the Galois field arithmetic operation circuit comprises:
        a base calculation circuit including m parallel arithmetic operation circuits, each of the m parallel arithmetic operation circuits configured to calculate one of m linear independent elements from the $2^m-1$ elements; and
        a linear development circuit configured to calculate a remaining $2^m-1-m$ elements of the $2^m-1$ elements by respective combination of the m linear independent elements.

5. The memory device of claim 4, wherein:
    the linear development circuit is configured to calculate the remaining $2^m-1-m$ elements not included in the m linear independent elements by respective combination of the m linear independent elements.

6. The memory device of claim 5, wherein the base calculation circuit and the linear development circuit are further configured to perform an arithmetic operation on a combined linear function, and wherein sections constituting a same linear space with respect to an error location detection polynomial are combined to generate the combined linear function.

7. The memory device of claim 6, wherein other sections besides the sections constituting the same linear space are developed based on the arithmetic operation that is performed by the base calculation circuit and the linear development circuit.

8. A Galois field arithmetic operation circuit, comprising:
    a base calculation circuit including a plurality of arithmetic operation circuits, each of the arithmetic operation circuits calculating a linear function corresponding to a particular factor of a polynomial, wherein a number of factors of the polynomial is greater than a number of arithmetic operation circuits in the base calculation circuit; and
    a linear development circuit configured to add an output of a first arithmetic operation circuit of the plurality of arithmetic operation circuits to an output of a second arithmetic operation circuit of the plurality of arithmetic operation circuits, and to separately add the output of the first arithmetic operation circuit to an output of a third arithmetic operation circuit of the plurality of arithmetic operation circuits.

9. The Galois field arithmetic operation circuit of claim 8, wherein the output of the first arithmetic operation circuit is Q(1), the output of the second arithmetic operation circuit is Q($\alpha$), and the output of the third arithmetic operation circuit is Q($\alpha^2$).

10. The Galois field arithmetic operation circuit of claim 9, further comprising:
   a first EXOR device configured to add Q(1) and Q($\alpha$) and to output Q($\alpha^3$); and
   a second EXOR device configured to add Q($\alpha$) and Q($\alpha^2$) and to output Q($\alpha^4$).

11. The Galois field arithmetic operation circuit of claim 10, further comprising:
   a third EXOR device configured to add the output of the second EXOR device to Q(1); and
   a fourth EXOR device configured to add Q(1) and Q($\alpha^2$).

12. The Galois field arithmetic operation circuit of claim 9, wherein:
   the first arithmetic operation circuit calculates a linear function (Q(1)=(p4)($1^4$)+(p2)($1^2$)+(p1)($1^1$) in an error location detection polynomial corresponding to factor X (1=$\alpha^0$) by a first matrix operation;
   the second arithmetic operation circuit calculates a linear function (Q($\alpha$)=(p4)($\alpha^4$)+(p2)($\alpha^2$)+(p1)($\alpha^1$) corresponding to factor X (=$\alpha^1$=$\alpha$) by a second matrix operation; and
   the third arithmetic operation circuit calculates a linear function (Q($\alpha^2$)=(p4)(($\alpha^2$)$^4$)+(p2)(($\alpha^2$)$^2$)+(p1)(($\alpha^2$)) corresponding to factor X (=$\alpha^2$) by a third matrix operation.

* * * * *